United States Patent
Yagi et al.

(10) Patent No.: US 10,161,032 B2
(45) Date of Patent: Dec. 25, 2018

(54) HIGH-PURITY TITANIUM INGOTS, MANUFACTURING METHOD THEREFOR, AND TITANIUM SPUTTERING TARGET

(71) Applicant: JX Nippon Mining & Metals Corporation, Tokyo (JP)

(72) Inventors: Kazuto Yagi, Ibaraki (JP); Eiji Hino, Ibaraki (JP); Yuichiro Shindo, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 591 days.

(21) Appl. No.: 14/371,111

(22) PCT Filed: Feb. 13, 2013

(86) PCT No.: PCT/JP2013/053307
§ 371 (c)(1),
(2) Date: Jul. 8, 2014

(87) PCT Pub. No.: WO2013/122069
PCT Pub. Date: Aug. 22, 2013

(65) Prior Publication Data
US 2015/0021174 A1  Jan. 22, 2015

(30) Foreign Application Priority Data
Feb. 14, 2012 (JP) .................... 2012-029486

(51) Int. Cl.
| | |
|---|---|
| C23C 14/34 | (2006.01) |
| C22C 14/00 | (2006.01) |
| C22C 1/03 | (2006.01) |
| C22C 1/10 | (2006.01) |
| C22B 9/22 | (2006.01) |
| C22B 34/12 | (2006.01) |
| C22C 1/02 | (2006.01) |
| H01J 37/34 | (2006.01) |

(52) U.S. Cl.
CPC ............ *C23C 14/3414* (2013.01); *C22B 9/22* (2013.01); *C22B 9/228* (2013.01); *C22B 34/1295* (2013.01); *C22C 1/02* (2013.01); *C22C 1/03* (2013.01); *C22C 1/1084* (2013.01); *C22C 14/00* (2013.01); *H01J 37/3426* (2013.01)

(58) Field of Classification Search
None
See application file for complete search history.

(56) References Cited

U.S. PATENT DOCUMENTS

| | | |
|---|---|---|
| 5,196,916 A | 3/1993 | Ishigami et al. |
| 5,204,057 A | 4/1993 | Ishigami et al. |
| 5,993,621 A | 11/1999 | Liu |
| 6,210,502 B1 | 4/2001 | Takahashi |
| 6,755,948 B1 | 6/2004 | Fukuyo et al. |
| 6,833,058 B1* | 12/2004 | Turner ................ C22B 34/1263 204/298.12 |
| 8,663,440 B2 | 3/2014 | Tsukamoto et al. |
| 2001/0054457 A1* | 12/2001 | Segal .................. C23C 14/3414 148/438 |
| 2007/0240981 A1 | 10/2007 | Schlott et al. |
| 2013/0186753 A1 | 7/2013 | Tsukamoto et al. |
| 2014/0027277 A1 | 1/2014 | Makino et al. |
| 2014/0251802 A1 | 9/2014 | Tsukamoto et al. |

FOREIGN PATENT DOCUMENTS

| | | |
|---|---|---|
| JP | 05-255843 A | 10/1993 |
| JP | 08-225980 A | 9/1996 |
| JP | H08-269698 A | 10/1996 |
| JP | 09-25522 A | 1/1997 |
| JP | 09-025565 A | 1/1997 |
| JP | 10-008245 A | 1/1998 |
| JP | 10-140339 A | 5/1998 |
| JP | 3621582 A | 12/1998 |
| JP | 2000-204494 A | 7/2000 |
| JP | 2000-219922 A | 8/2000 |
| JP | 2003-234445 A | 8/2003 |

(Continued)

OTHER PUBLICATIONS

Miracle et al. (Review: Microstructure Engineering of Titanium Alloys via Small Boron Additions, Air Force Research Lab, Jul. 2011).*
Machine translation of JP05-255843, Oct. 1993.*
Kanayama, Electron Beam Melting of Sponge Titanium, ISIJ International, 1991, vol. 31, p. 906-914.*

*Primary Examiner* — Xiaowei Su
(74) *Attorney, Agent, or Firm* — Howson & Howson LLP

(57) ABSTRACT

Provided is a high-purity titanium ingot having a purity, excluding an additive element and gas components, of 99.99 mass % or more, wherein at least one nonmetallic element selected from S, P, and B is contained in a total amount of 0.1 to 100 mass ppm as the additive component and the variation in the content of the nonmetallic element between the top, middle, and bottom portions of the ingot is within ±200%. Provided is a method of manufacturing a titanium ingot containing a nonmetallic element in an amount of 0.1 to 100 mass ppm, wherein S, P, or B, which is a nonmetallic element, is added to molten titanium as an intermetallic compound or a master alloy to produce a high-purity titanium ingot having a purity, excluding an additive element and gas components, of 99.99 mass % or more. It is an object of the present invention to provide a high-purity titanium having decreased intra- and inter-ingot variations in the content of the nonmetallic element, a uniform structure, and improved strength by containing at least one nonmetallic element selected from S, P, and B.

11 Claims, No Drawings

(56) References Cited

FOREIGN PATENT DOCUMENTS

| | | |
|---|---|---|
| JP | 2003-253411 A | 9/2003 |
| JP | 2009-113060 A | 5/2009 |
| JP | 2010-235998 A | 10/2010 |

* cited by examiner

HIGH-PURITY TITANIUM INGOTS, MANUFACTURING METHOD THEREFOR, AND TITANIUM SPUTTERING TARGET

BACKGROUND

The present invention relates a high-purity titanium ingot, a manufacturing method therefore, and a titanium sputtering target. The high-purity titanium ingot or target contains a nonmetallic element, has a uniform structure with low intra- and inter-ingot variations or intra- and inter-target variations, and has high strength. Throughout the specification, the impurity concentration is expressed as ppm by mass (mass ppm).

In recent years, various electronic instruments have been developed originated from a significant progress of semiconductors, and improvements in performance of the instruments and development of novel instruments are being performed daily and hourly.

In such a circumstance, there is a tendency that electronic devices and instruments are further reduced in size and are increased in degree of integration. A large number of thin films are formed in various steps of manufacturing these instruments, and titanium is also utilized, because of the specific metallic properties thereof, in formation of thin films of many electronic instruments as, for example, titanium or its alloy films, titanium silicide films, or titanium nitride films.

In general, films of titanium, its alloy, titanium silicide, titanium nitride or the like as described above can be formed by physical vapor deposition such as sputtering and vacuum vapor deposition. In particular, high-purity titanium is used as a wiring material of semiconductors.

Wiring of a semiconductor is usually formed by sputtering. The sputtering is a method of allowing positive ions such as $Ar^+$ to physically collide with an ingot disposed on the cathode to release metal atoms constituting the ingot by the collision energy. A nitride can be formed by sputtering using titanium or its alloy as an ingot in an atmosphere of a gas mixture of argon gas and nitrogen.

Recently, there is a demand for high-rate sputtering (high-power sputtering) in order to increase the production efficiency. In such sputtering, cracking or breaking of the ingot is apt to occur, and this disadvantageously prevents stable sputtering. It is therefore important that titanium itself has high strength. Titanium targets and methods of producing titanium targets are described in, for example, Patent Documents 1 to 8. Methods of producing high-purity titanium are described in, for example, Patent Documents 9 to 11.

Patent Document 1: International Publication No. WO01/038598
Patent Document 2: JP 2001-509548 A
Patent Document 3: JP H09-25565 A
Patent Document 4: JP 2000-219922 A
Patent Document 5: JP 2010-235998 A
Patent Document 6: JP H10-140339 A
Patent Document 7: Japanese Patent No. 3621582
Patent Document 8: JP 2004-518814 A
Patent Document 9: JP H08-225980 A
Patent Document 10: JP H09-25522 A
Patent Document 11: JP 2000-204494 A

SUMMARY

It is an object of the present invention to provide a high-quality and high-purity titanium ingot useful for, in particular, a titanium target that can prevent occurrence of cracking and breaking even in high-power sputtering (high-rate sputtering), and can stabilize sputtering characteristics, by allowing high-purity titanium to have increased strength and a uniformized structure.

For the high-purity titanium ingot necessary for achieving the object, an additive element at a concentration of several to several tens wtppm is uniformly distributed in high-purity titanium.

An electron beam (EB) melting process can efficiently dissolve a high-purity metal and is suitable for preparing an ingot, but is inadequate as a method for producing an alloy ingot, in particular, an ingot containing a trace element. The reasons of this are as follows: an ordinary alloy melting furnace is an alloy holding furnace for giving a uniform alloy having an intended composition or has a molten metal pool in the configuration of the furnace. In the EB melting furnace, however, the molten metal pool is only the skull portion on the upper side of an ingot, and a mechanism for supplying a raw material alloy having a certain composition is necessary for giving a uniform alloy composition.

Further, the skull portion in EB melting has a solidification interface, which is the constitutive boundary between a metallic melt and a solid ingot. Accordingly, a compositional shift, i.e., segregation, due to the difference in equilibrium partitioning ratio of each compositional metal disadvantageously occurs at the interface. In addition, the strong heating effect of EB disadvantageously causes a compositional shift due to the difference in evaporation rate of each compositional element of the alloy.

The present invention enables production of a high-purity titanium ingot in which a trace additive element is uniformly distributed by an EB melting process, wherein the advantageous function of the EB melting in enabling production of a high-purity titanium ingot is maintained, and the problem in alloy melting, i.e., the drawback of the EB melting furnace, was solved by inventive ideas.

Accordingly, the present invention provides the followings:

1) a high-purity titanium ingot or target having a purity, excluding an additive element and gas components, of 99.99 mass % or more, the high-purity titanium characterized in that at least one nonmetallic element selected from sulfur (S), phosphorus (P), and boron (B) is contained in a total amount of 0.1 to 100 mass ppm as the additive component and the variation in the content of the nonmetallic element between the top, middle, and bottom portions of the ingot or target is within ±200%;
2) the high-purity titanium according to 1), wherein the variation in the content of the nonmetallic element in a plane (in the radial direction) at the middle portion of the ingot is within ±200%;
3) the high-purity titanium according to 1) or 2), wherein the variation in the content of the nonmetallic element between different ingots is within ±200%;
4) the high-purity titanium according to any one of 1) to 3), wherein the variation in the content of the nonmetallic element is within ±100%;
5) the titanium ingot according to any one of 1) to 4), wherein at least one nonmetallic element selected from S, P, and B is added as a master alloy piece having a cross-sectional area of 2000 to 18000 $mm^2$ and a thickness of 1 to 10 mm; and
6) the titanium ingot according to any one of 1) to 5), wherein the titanium ingot is a high-purity titanium ingot produced by an arc melting process or an EB melting process; the concentration of a trace element added at the time of starting melting in the arc melting process or the EB melting process is adjusted to be three times the concentration in an intended composition; and the additive amount is then decreased to one third of the concentration in the intended composition with the progress of the melting.

The present invention also provides the followings:

7) a method of manufacturing titanium containing a non-metallic element in an amount of 0.1 to 100 mass ppm, wherein S, P, or B, which is a nonmetallic element, is added to molten titanium as an intermetallic compound or a master alloy to produce a high-purity titanium ingot having a purity, excluding an additive element and gas components, of 99.99 mass % or more;

8) the method of manufacturing titanium according to 7), wherein the variation in the content of the nonmetallic element between the top, middle, and bottom portions of the ingot is within ±200%;

9) the method of manufacturing titanium according to 8), wherein the variation in the content of the nonmetallic element in a plane (in the radial direction) at the middle portion of the ingot is within ±200%;

10) the method of manufacturing titanium according to any one of 7) to 9), wherein the variation in the content of the nonmetallic element between different ingots is within ±200%;

11) the method of manufacturing titanium according to any one of 7) to 10), wherein the variation in the content of the nonmetallic element is within ±100%;

12) the titanium ingot according to any one of 7) to 11), wherein at least one nonmetallic element selected from S, P, and B is added as a master alloy piece having a cross-sectional area of 2000 to 18000 mm$^2$ and a thickness of 1 to 10 mm;

13) the titanium ingot according to any one of 7) to 12), the method of manufacturing the titanium ingot through an arc melting process or an EB melting process, wherein the concentration of a trace element added at the time of starting melting in the arc melting process or the EB melting process is adjusted to be three times the concentration in an intended composition, and the additive amount is then decreased to one third of the concentration in the intended composition with the progress of the melting; and 14) a titanium sputtering target manufactured by machining the titanium ingot according to any one of aspects 1) to 6).

Advantageous Effects of Invention

The high-purity titanium ingot or target contains at least one nonmetallic element selected from S, P, and B and thereby has excellent effects of decreasing the intra- and inter-ingot variations in the content of the nonmetallic element, providing a uniform structure, and increasing the strength. As a result, an excellent material as a titanium wiring material of semiconductors can be provided. In particular, the invention has excellent effects of forming a high-quality film without causing cracking or breaking even in high-power sputtering (high-rate sputtering) and of stabilizing sputtering characteristics.

DETAILED DESCRIPTION

The high-purity titanium ingot of the present invention is produced by an arc melting process or an EB melting process. The EB melting process is a method of producing a titanium ingot by successively and continuously performing electron beam (EB) irradiation in ultrahigh vacuum to titanium sponge as a raw material supplied by a feeder, pooling the molten titanium in a water-cooled copper crucible, and gradually extracting the titanium downward.

The EB melting process is an effective method for producing a titanium ingot. The arc melting process can also produce a titanium ingot by a similar process. In the followings descriptions, the EB melting process is typically described, and the arc melting process is also optionally described.

The producing rate of an ingot varies depending on the scale of the EB melting apparatus and is approximately 1 to 10 kg per minute. In the case of adding an additive agent to the ingot produced at such a producing rate, the additive agent is added at a rate of 0.01 to 1 g per minute for adjusting the concentration of the additive element to several tens mass ppm.

If the intended concentration of the additive element is several mass ppm, the amount of the additive agent is further small. The additive agent in such an amount is in a powder form, and a precise amount of the additive agent cannot be directly added to titanium sponge that is conveyed with a feeder because the additive agent (powder) may fall into a gap of the feeder or float on the surface of the molten metal, resulting in variation of the composition. Thus, due to the structure of the EB melting apparatus, it is very difficult to directly subject a small amount of an additive agent and titanium sponge, simultaneously, to EB melting.

Accordingly, it was tried to produce a titanium ingot containing a trace additive element by producing a master alloy and adding the master alloy to titanium sponge during EB melting. In this process, it must be guaranteed that the concentration of the additive element in the produced master alloy is uniform.

On the basis above, a master alloy was produced by a skull melting process. In the skull melting process, a stirring effect by electromagnetic induction uniformly mixes the additive element with the molten titanium, and the molten titanium after the completion of melting is rapidly cooled because that the skull is constantly in contact with a water-cooled copper crucible. As a result, a titanium ingot containing the additive element having uniform concentration distribution without causing segregation in the titanium ingot can be produced.

The skull melting also has an advantage that constitutional elements of the crucible do not contaminate the product as impurities, unlike usual melting using a ceramic crucible, to give a titanium ingot having high purity.

Subsequently, the master alloy produced by skull melting is cut into a size such that the master alloy pieces can be easily mixed with titanium sponge. The titanium sponge usually has a size ranging from about 50 to 150 mm in an indefinite shape.

Accordingly, the master alloy is cut into a shape having a cross-sectional area of 2000 to 18000 mm$^2$ and a thickness of 1 to 10 mm. A test demonstrated that a large number of the master alloy pieces cut into such a shape can be well mixed with titanium sponge. Accordingly, the above-mentioned size of the master alloy enhances mutual mixing of the both and is therefore a great advantage for homogenizing the component composition of the titanium ingot.

On the basis of the above, the present inventors have developed a method involving addition of a trace element to a high-purity titanium ingot prepared by EB melting. However, if the equilibrium partitioning ratio of the solute element to the parent phase metal is large, that is, if the equilibrium partitioning ratio of a trace additive element to titanium is large, the concentration of the trace additive element in liquid- or solid-phase titanium largely varies, resulting in a risk of segregation.

As a result, it was revealed that the concentration of the trace additive element is not uniformly distributed at the bottom portion and the top portion of the titanium ingot. Accordingly, in the production of a sputtering target from an ingot, the concentration of the trace additive element contained in the titanium target varies depending on the portion of the titanium ingot from which the titanium target is cut out, leading to a risk of producing titanium targets with different qualities.

As a countermeasure against this problem, a system of adding a trace element by a master alloy method is further improved. That is, in the case of positive segregation of the trace element added to titanium, the amount of a master alloy to be subjected to EB melting together with titanium sponge at the time of starting the EB melting is adjusted to be higher than the concentration in an intended composition, and the additive amount is then decreased with the progress of the melting.

The nonmetallic elements, S, P, and B, as the additive components in the present invention are all materials showing positive segregation.

It was revealed as a result that the positive segregation causes a gradient counter to the concentration gradient of the trace additive element in a titanium ingot to cancel the concentration gradient and thereby the concentration gradient in the vertical direction of the ingot can be reduced to be homogenous.

Specifically, the concentration of a trace element added at the time of starting EB melting is adjusted to be about three times the concentration in an intended composition, and the additive amount is then decreased to one third of the concentration in the intended composition with the progress of the melting.

Consequently, in an EB melting process, the concentration gradient in the vertical direction of the ingot can be reduced to be approximately homogenous to achieve an excellent effect of reducing segregation in the production of a titanium ingot.

On the other hand, in the case of negative segregation of the trace additive element to the parent phase titanium (the number of additive elements showing negative segregation to titanium is small), the concentration of the additive element may be the same as the concentration in an intended composition. The negative segregation does not cause any problem regarding the concentration gradient in the vertical direction in the ingot.

For such adjustment of the concentration gradient of the additive element, it is effective to actually repeat experimental EB melting several times and thereby empirically determine the distribution. Unfortunately, the conditions of the experiment vary depending on the amount of molten high-purity titanium ingot and the type and concentration of the additive element. As a more efficient and lower cost method, it is efficient and practical to calculate imaginary EB melting involving addition of a trace element by application of simulation software and determine optimum distribution of the additive amount from the results.

The high-purity titanium ingot of the present invention or the sputtering target produced from the ingot has a high purity of 99.99 mass % or more and preferably has a purity of 99.995 mass % or more. The purity of the titanium ingot is one excluding the additive component and gas components.

In general, the amount of the gas components, such as oxygen, nitrogen, and hydrogen, contaminating the titanium ingot is larger than that of other impurity elements. A smaller amount of the gas components is preferred, but the amount in usual contamination does not harmfully affect the achievement of the object of the present invention.

Throughout the specification, the term "ingot" refers to a cast ingot and also an ingot prepared by forging the cast ingot. The ingot may be referred to as a billet depending on the shape, and the term "ingot" also refers to one having such a shape. In the following descriptions, ingots are mainly described, but sputtering targets are also encompassed in the present invention, as described above.

In a sputtering target, the cut-out ingot is used as a target directly or after rolling. Since the both are the same material, the component compositions and the structures thereof are the same as long as no specific additional process is performed.

One characteristic of the present invention is that the ingot contains at least one nonmetallic element selected from S, P, and B as an additive component in a total amount of 0.1 to 100 mass ppm. The addition of the nonmetallic element to the ingot allows production of a titanium ingot in which the variation in the content of the nonmetallic element between the top, middle, and bottom portions of the ingot is within ±200%.

In addition, a titanium ingot in which the variation in the content of the nonmetallic element in a plane (in the radial direction) at the middle portion of the ingot is within ±200% can be provided, and also titanium ingots in which the variation in the content of the nonmetallic element between different ingots is within ±200% can be provided.

These titanium ingots can achieve a variation in the content of the nonmetallic element within ±100%.

In the production of a high-purity titanium ingot having a purity, excluding an additive element and gas components, of 99.99 mass % or more, a high-purity titanium ingot containing 0.1 to 100 mass ppm of a nonmetallic element, S, P, or B, and having a purity of 99.99 mass % or more can be produced by adding the nonmetallic element into molten titanium as an intermetallic compound or as a master alloy containing 100 to 10000 ppm of the nonmetallic element.

If only S or P is added to molten titanium, S or P volatilizes during the melting process and S cannot remain in the ingot. Addition of S or P as an intermetallic compound allows S or P to be contained in the ingot. Examples of the intermetallic compound include MgS, CaS, ZnS, CdS, PbS, HgS, and $TiS_2$. The same can apply to P. Sulfur or phosphorus of the intermetallic compound binds to Ti during the melting and is contained in the titanium ingot, but other elements such as Mg volatilize.

On the other hand, B hardly volatilizes but has a melting point of about 2030° C., which is very high compared to the melting point, 1668° C., of Ti. Therefore, if B is added to a titanium ingot as a simple substance, B remains unmelted. Being heated above the melting temperature causes sublimation, and thereby B cannot remain in titanium. Accordingly, it is recommended to add B in a form of $TiB_2$ or a master alloy containing 100 to 10000 ppm of B.

The intra- or inter-ingot variation can be further reduced by forming a master alloy of the element and adding the alloy to the ingot.

As described in Examples below, the ingot has high strength and maintains the high strength despite being affected by heat. This can achieve a great effect of inhibiting occurrence of cracking and breaking of the ingot. Similarly, a target uniformly containing S, P, or B can be produced.

As described above, S, P, or B is uniformly contained in the ingot without volatilizing in the case of S and P and without remaining unmelted or volatilizing in the case of B during the melting process by adding each element as an intermetallic compound or as a master alloy.

The ingot has high strength and maintains the high strength despite being affected by heat, and this means that the ingot is provided with an effect of inhibiting occurrence of cracking and breaking in the ingot. This phenomenon also shows an effect of inhibiting occurrence of cracking and breaking not only in the ingot before the start of sputtering but also in the target during the sputtering at a high temperature of 700° C. In addition, stable sputtering characteristics are provided to effectively form a uniform film.

In addition, the target has high strength and maintains the high strength despite being affected by heat. This can reduce the warpage during sputtering and distortion of the target surface by thermal stress or thermal fatigue due to ON/OFF of the sputtering power to effectively prevent cracking of the target.

The effects described above can be achieved when the titanium ingot itself has a high purity and contains at least one nonmetallic element selected from S, P, and B as an additive component in a total amount of 0.1 to 100 mass ppm. These numerical ranges show the ranges that can realize the effectiveness of the present invention.

A value lower than the lower limit cannot achieve the object of the present invention, and a value higher than the upper limit cannot ensure the purity as a high-purity ingot. Consequently, the above-mentioned range is determined.

In order to produce high-purity titanium, a known method, a Kroll process or molten salt electrolysis, can be used. Predetermined amounts of the resulting titanium and at least one nonmetallic element selected from S, P, and B are mixed and are molten by arc melting or electron beam (EB) melting. The molten mixture is cooled and solidified to produce an ingot, which is produced into a billet by hot forging at 800° C. to 950° C. or hot plastic forming such as hot extrusion. These processes can destroy the ununiform and coarse cast structure of the ingot to provide a uniform refined ingot.

The resulting billet is provided with high distortion by repeating cold forging or cold plastic deformation such as cold extrusion to give an ingot having a homogeneously refined crystalline structure of 30 μm or less.

Subsequently, the billet is cut into preforms each having a volume corresponding to that of an ingot. The preform is further provided with high distortion by cold forging or cold plastic forming such as cold extrusion and is formed into a target, for example, in a disk shape.

These production processes are an example of the method of manufacturing the high-purity titanium ingot and target of the present invention, and any process can be employed as long as the process can give a high-purity titanium ingot or target having a purity, excluding an additive component and gas components, of 99.99 mass % or more by adding a nonmetallic element, S, P, or B, as an intermetallic compound into molten titanium.

EXAMPLES

Examples of the present invention will now be described. The following Examples are merely examples, and the present invention is not limited thereto. In other words, the present invention includes all other modes and modifications other than these Examples within the scope of the technical idea of the invention.

Example 1

Sulfur was added to 4N5 Ti as an intermetallic compound, ZnS, such that 1 ppm of S was uniformly mixed with 4N5 Ti sponge and dissolved therein by arc melting. As a result, the contents of S in the ingot were 1.7 ppm at the top portion (TOP), 1 ppm at the middle portion (Middle), and 0.5 ppm at the bottom portion (BTM), and the intra-ingot variation was within ±100%. The intermetallic compound, ZnS, was in a shape having a cross-sectional area of 2000 to 18000 mm$^2$ and a thickness of 1 to 10 mm. In the arc melting, the concentration of the trace element added at the time of starting melting was adjusted to be three times the concentration in an intended composition, and the additive amount was then decreased to one third of the concentration in the intended composition with the progress of the melting. The molten titanium was pooled in a water-cooled copper mold and was gradually extracted downward to produce a titanium ingot.

The contents of S at the middle portion were 0.6 ppm at an end, 1.0 ppm at ½ R, and 1.2 ppm at the center, in a plane. The average contents of S were 0.7 ppm in the first lot, 1.0 ppm in the fifth lot, and 0.8 ppm in the tenth lot, and the inter-ingot variation was also within ±100%.

The contents of S in a target produced from the titanium ingot were also 0.8 to 1.0 ppm to show a very low variation. The contents of S in different targets were 0.7 to 1.0 ppm and were also very uniform. Similar results were obtained in an EB melting process.

Example 2

Sulfur was added to 4N5 Ti as a master alloy containing 200 ppm of S such that 0.2 ppm of S was uniformly mixed with 4N5 Ti sponge and dissolved therein by EB melting. The master alloy was in a shape having a cross-sectional area of 2000 to 18000 mm$^2$ and a thickness of 1 to 10 mm. In the EB melting, the concentration of the trace element added at the time of starting melting was adjusted to be three times the concentration in an intended composition, and the additive amount was then decreased to one third of the concentration in the intended composition with the progress of the melting. The molten titanium was pooled in a water-cooled copper mold and was gradually extracted downward to produce a titanium ingot.

As a result, the contents of S in the ingot were 0.2 ppm at TOP, 0.1 ppm at Middle, and 0.1 ppm at BTM, and the intra-ingot variation was within ±100%. The contents of S at the middle portion were 0.12 ppm at an end, 0.1 ppm at ½ R, and 0.25 ppm at the center in a plane. The average contents of S were 0.16 ppm in the first lot, 0.20 ppm in the fifth lot, and 0.19 ppm in the tenth lot, and the inter-ingot variation was also within ±100%. Similar results were obtained in an arc melting process.

Example 3

Sulfur was added to 4N5 Ti as a master alloy containing 10000 ppm of S such that 90 ppm of S was uniformly mixed with 4N5 Ti sponge and dissolved therein by arc melting. The intermetallic compound, ZnS, was in a shape having a cross-sectional area of 2000 to 18000 mm$^2$ and a thickness of 1 to 10 mm. In the arc melting, the concentration of the trace element added at the time of starting melting was adjusted to be three times the concentration in an intended composition, and the additive amount was then decreased to one third of the concentration in the intended composition with the progress of the melting. The molten titanium was pooled in a water-cooled copper mold and was gradually extracted downward to produce a titanium ingot.

As a result, the contents of S in the ingot were 120 ppm at TOP, 90 ppm at Middle, and 80 ppm at BTM, and the intra-ingot variation was ±100%. The contents of S at the middle portion were 110 ppm at an end, 80 ppm at ½ R, and 90 ppm at the center in a plane. The average contents of S were 85 ppm in the first lot, 80 ppm in the fifth lot, and 90 ppm in the tenth lot, and the inter-ingot variation was also within ±100%. Similar results were obtained in an EB melting process.

Comparative Example 1

S was added as a simple substance, and the added S mostly volatilized and was not remained in an ingot. The S content in the ingot was 0.01 ppm or less.

Comparative Example 2

P was added as a simple substance, and the added P mostly volatilized and was not remained in an ingot. The P content in the ingot was 0.01 ppm or less.

Comparative Example 3

Boron added as a simple substance in an amount of 1 ppm did not volatilize, but the intra-ingot variation was very high. EB melting was used herein (similar results were obtained in an arc melting process). As a result, the contents of B were 0.2 to 10 ppm at TOP, 0.1 to 3 ppm at Middle, and <0.1 to 2 ppm at BTM, and the intra-ingot variation was out of ±100%.

The contents of B at the middle portion were 3 ppm at an end, 0.1 ppm at ½ R, and 2.5 ppm at the center in a plane. The inter-ingot variation could not be defined by average contents, and B partially remained unmelted. A large amount of cracking occurred in the subsequent processes, resulting in impossibility of production into a billet or target.

The present invention can provide a high-purity titanium ingot that can prevent occurrence of cracking and breaking even in high-power sputtering (high-rate sputtering), can stabilize sputtering characteristics, and has high quality. The ingot is useful for forming thin films of, for example, electronic instruments.

The invention claimed is:

1. A method of manufacturing a high purity titanium ingot containing at least one nonmetallic element selected from the group consisting of S, P and B in a total amount of 0.1 to 100 mass ppm, wherein the method comprises the steps of feeding successively and continuously a raw material titanium to an arc melting furnace or an electron beam (EB) melting furnace by using a feeder, melting continuously the raw material titanium fed successively and continuously to produce molten titanium, adding the at least one nonmetallic element to the molten titanium during progress of said melting step to produce a melt containing the at least one nonmetallic element, an amount of the at least one nonmetallic element added during said adding step is decreased during the progress of said melting step, feeding continuously the melt containing the at least one nonmetallic element to a water-cooled copper mold to form a pool of the melt containing the at least one nonmetallic element, and withdrawing downward a solidified part of the pool from a bottom end of the copper mold at a rate of 1 to 10 kg per minute to produce the high purity titanium ingot having a purity of 99.99 mass % or higher excluding the at least one nonmetallic element and gas components, the at least one nonmetallic element being added to the molten titanium in a form of an intermetallic compound or a master alloy, the ingot having a variation in contents of the at least one nonmetallic element in an amount within ±200% with respect to an intended concentration thereof, the contents being measured at top, middle, and bottom portions of the ingot, the middle portion being a portion midway between the top and bottom portions.

2. The method of manufacturing a titanium ingot according to claim 1, wherein the ingot has a variation in contents of each of the at least one nonmetallic element in an amount within ±200% with respect to the intended concentration thereof for contents measured at edge, half-way, and center portions in a cross-sectional face of the ingot, the half-way portion being located half a distance from the center portion to the edge portion, and the cross-sectional face of the ingot being taken perpendicularly to a longitudinal direction of the ingot and at a half-way between the top and bottom portions of the ingot.

3. The method of manufacturing a titanium ingot according to claim 2, wherein the variation for contents measured at the edge, half-way, and center portions in the cross-sectional face is within ±100%.

4. The method of manufacturing a titanium ingot according to claim 1, wherein ingots in different melting lots have a variation in average contents of each of the at least one nonmetallic element in an amount within ±200% with respect to the intended concentration thereof, the average contents being measured for each of the different melting lots.

5. The method of manufacturing a titanium ingot according to claim 4, wherein the variation in average contents of each of the at least one nonmetallic element is within ±100% with respect to the intended concentration thereof.

6. The method of manufacturing a titanium ingot according to claim 5, wherein the at least one nonmetallic element added to the molten titanium is added in the form of the master alloy in a shape having a cross-sectional area of 2000 to 18000 $mm^2$ and a thickness of 1 to 10 mm.

7. The method of manufacturing a titanium ingot according to claim 6, wherein the addition of the at least one nonmetallic element is performed by adjusting an added amount of the at least one nonmetallic element at a time of starting the melting such that the added amount of the at least one nonmetallic element is at a concentration which is three times the intended concentration of the at least one nonmetallic element in the ingot and by decreasing the added amount during the melting until at an end of the melting the added amount is adjusted such that the added amount of the at least one nonmetallic element is at a concentration which is one third of the intended concentration of the at least one nonmetallic element in the ingot.

8. The method of manufacturing a titanium ingot according to claim 1, wherein the at least one nonmetallic element added to the molten titanium is added in the form of the master alloy of a shape having a cross-sectional area of 2000 to 18000 $mm^2$ and a thickness of 1 to 10 mm.

9. The method of manufacturing a titanium ingot according to claim 1, wherein the addition of the at least one nonmetallic element is performed by adjusting an added amount of the at least one nonmetallic element at a time of starting the melting such that the added amount of the at least one nonmetallic element is at a concentration which is three times the intended concentration of the at least one nonmetallic element in the ingot and by decreasing the added amount during the melting until at an end of the melting the added amount is adjusted such that the added amount of the at least one nonmetallic element is at a concentration which is one third of the intended concentration of the at least one nonmetallic element in the ingot.

10. The method of manufacturing a titanium ingot according to claim 1, wherein the variation is within ±100%.

11. A method of manufacturing a high purity titanium ingot containing at least one nonmetallic element in a total amount of 0.1 to 100 mass ppm, comprising the steps of:

feeding a raw material titanium to an arc melting furnace or an electron beam (EB) melting furnace with a feeder;

melting successively and continuously the raw material titanium fed to produce molten titanium;

adding at least one nonmetallic element to the molten titanium during progress of said melting step to produce a melt containing the at least one nonmetallic element, an amount of the at least one nonmetallic element added during said adding step being decreased during the progress of said melting step, feeding continuously the melt containing the at least one nonmetallic element to a water-cooled copper mold to form a pool of the melt containing the at least one nonmetallic element; and extracting downward a solidified part of the pool from a bottom end of the copper mold to produce the high purity titanium ingot having a purity of 99.99 mass % or higher excluding the at least one nonmetallic element and gas components;

the at least one nonmetallic element being selected from the group consisting of S, P and B and being added to the molten titanium in a form of an intermetallic compound or a master alloy; and the ingot having a variation in contents of the at least one nonmetallic element at top, middle, and bottom portions of the ingot within ±200%, the middle portion being a portion midway between the top and bottom portions.

* * * * *